(12) United States Patent
Wu et al.

(10) Patent No.: US 10,923,621 B2
(45) Date of Patent: Feb. 16, 2021

(54) METHOD FOR REDUCTION OF INTERFACIAL STRESS ACCUMULATION BETWEEN DOUBLE SIDE COPPER-PLATED LAYERS AND ALUMINUM NITRIDE SUBSTRATE

(71) Applicant: National Chung-Shan Institute of Science and Technology, Taoyuan (TW)

(72) Inventors: Chun-Te Wu, Taoyuan (TW); Yang-Kuo Kuo, Taoyuan (TW); Cheng-Hung Shih, Taoyuan (TW); Hong-Ting Huang, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 0 days.

(21) Appl. No.: 16/663,358

(22) Filed: Oct. 25, 2019

(65) Prior Publication Data

US 2020/0152825 A1    May 14, 2020

(30) Foreign Application Priority Data

Nov. 14, 2018 (TW) .............................. 107140694 A

(51) Int. Cl.
*H01L 23/373* (2006.01)
*H01L 33/00* (2010.01)
(Continued)

(52) U.S. Cl.
CPC ...... *H01L 33/0075* (2013.01); *H01L 21/4846* (2013.01); *H01L 23/15* (2013.01); *H01L 23/3735* (2013.01); *H01L 23/498* (2013.01); *H01L 23/49827* (2013.01); *H01L 23/562* (2013.01); *H01L 33/0095* (2013.01); *H05K 1/0271* (2013.01); *H05K 1/0306* (2013.01); *H05K 3/388* (2013.01); *H01L 2933/0025* (2013.01); *H05K 2201/0338* (2013.01); *H05K 2201/0379* (2013.01);
(Continued)

(58) Field of Classification Search
CPC .......... H01L 23/3735; H01L 23/49827; H01L 23/15; H01L 23/562; H01L 21/4846; H05K 1/0306; H05K 1/0271
See application file for complete search history.

(56) References Cited

U.S. PATENT DOCUMENTS 9,564,392 B2 *  2/2017  Furutani .............. H01L 25/105
9,951,434 B2 *  4/2018  Furutani ............. H05K 1/0366
(Continued)

*Primary Examiner* — Bac H Au
(74) *Attorney, Agent, or Firm* — Winston Hsu

(57) ABSTRACT

The present invention uses a photolithography process and an electroplating process to perform. TAV copper filling and patterning of the fabrication of the double side copper-plated layers to plate the double side copper-plated layers in advance at the TAV through holes to serve as a stress buffer layer of the aluminum nitride substrates. Then the subsequent pattern designs of the copper-plated layers are customized. According to the simulation theory calculations, it is proved that the stress which accumulates on the short-side of the copper-plated layer of the aluminum nitride substrate with the asymmetric structure may be effectively reduced to facilitate the improvement of the reliability of the aluminum nitride substrate.

3 Claims, 5 Drawing Sheets

(51) Int. Cl.
*H01L 23/15* (2006.01)
*H05K 1/02* (2006.01)
*H05K 3/38* (2006.01)
*H01L 23/498* (2006.01)
*H05K 1/03* (2006.01)
*H01L 23/00* (2006.01)
*H01L 21/48* (2006.01)

(52) U.S. Cl.
CPC ............... *H05K 2201/0394* (2013.01); *H05K 2201/09563* (2013.01); *H05K 2201/09736* (2013.01)

(56) References Cited

U.S. PATENT DOCUMENTS

| | | | |
|---|---|---|---|
| 10,529,646 B2* | 1/2020 | Dan | B32B 18/00 |
| 2007/0261778 A1* | 11/2007 | Schulz-Harder | B32B 18/00 |
| | | | 156/89.18 |
| 2010/0260988 A1* | 10/2010 | Schulz-Harder | C04B 41/52 |
| | | | 428/213 |
| 2012/0111610 A1* | 5/2012 | Kim | H01L 23/3735 |
| | | | 174/252 |
| 2012/0182692 A1* | 7/2012 | Mori | C04B 37/021 |
| | | | 361/709 |
| 2013/0328200 A1* | 12/2013 | Bae | H01L 23/49827 |
| | | | 257/762 |
| 2016/0254218 A1* | 9/2016 | Hong | H01L 21/565 |
| | | | 257/773 |
| 2016/0262271 A1* | 9/2016 | Nazarenko | H05K 1/09 |

* cited by examiner

METHOD FOR REDUCTION OF INTERFACIAL STRESS ACCUMULATION BETWEEN DOUBLE SIDE COPPER-PLATED LAYERS AND ALUMINUM NITRIDE SUBSTRATE

BACKGROUND OF THE INVENTION

1. Field of the Invention

The present invention provides a symmetric buffer layer structure to reduce the interfacial stress which may accumulate between double side copper-plated layers and an aluminum nitride substrate. By the use of the photolithography process and the electroplating process to complete the preparation of the structure, it may effectively reduce the stress of double side copper-plated layers of an asymmetric structure on the TAV aluminum nitride substrate to accumulate on the surface of the short side copper-plated layer to facilitate the improvement of the reliability of the aluminum nitride substrate.

2. Description of the Prior Art

At present, the most popular research subject of the 3DIC assembly packaging in the semiconductor industry is the copper-filling technology of the through-silicon via. Because the through-silicon via technology has advantages such as good electrical properties, low power, small size, high density and high performance . . . for use in the IC packages, it is mainly used in DRAM products. However, the aluminum nitride material has excellent properties such as high thermal conductivity, high electrical insulation, and thermal expansion coefficient similar to that of those semiconductor materials such as GaN and AlGaN, it may be used to replace the Si and sapphire substrates for use in the applications such as power devices (IGBT, MOSFET) and high-power LED packaging to show much better performance of the electronic elements because the current Si material has limited maximal electric current, poor insulation so the excessive current will cause damages to the material.

When the through-via technology is applied to an aluminum nitride (AlN) wafer, it is defined as a TAV (through-aluminum nitride via) technology. First, through holes are formed by laser or by dry etching (ICP) on an aluminum nitride substrate. Then a conductive seed layer is formed by sputtering or by chemical plating (electroless plating) on the entire surface of the substrate and in the through holes. At last, copper material or other conductive material (such as tungsten material) is used along with an electroplating process to fill up or to fill hole walls to form on the surface of the substrate and in the TAV. TAV provides not only electrical connections, but also a heat dissipation path to increase the capability of the heat dissipation of the entire system.

In the TAV process of the aluminum nitride substrate and metallized thin film plating, it is necessary to carry out a plurality of thermal processes. The thermal processes may cause the hole-filling material to protrude to lower the yield. Since the conductive material fills from the sidewall of the through holes to the center of the through holes in the hole filling process, void forms if it fails to fill completely, so the overall electrical resistance rises to jeopardize the conduction efficiency of the electrical signals, and further the air inside the holes forms exploded holes if it is under a high temperature environment. The resultant wafers after the process have residual stress to jeopardize the reliability of the subsequent LED packages in applications, such as the delamination of the hole-filling material from the copper wall or the bonding stress between the LED package and the substrate.

The process for the surface metal routing on the aluminum nitride substrate and for the copper-filled through holes are as follows: first through holes are formed by laser or by dry etching (ICP) on an aluminum nitride substrate. Then a conductive seed layer is formed by sputtering or by chemical plating (electroless plating) on the entire surface of the substrate and in the through holes. At last, copper material or other conductive material (such as tungsten material) is used along with an electroplating process to fill up or to fill hole walls to form on the surface of the substrate and in the TAV. In order to improve the heat dissipation ability and the electrical conductive efficiency, the thickness of the copper layer of the metal circuit on the surface of the ceramic substrate will be increased. The general thickness of the copper-plated layer of the commercially available metallized ceramic substrate is 50 μm to 100 μm. The thickness of the copper plating layer would be greater if there are special demands on heat dissipation and electrical properties.

FIG. 1 shows a self-made metallized aluminum nitride substrate with patterned TAV. Each small piece of TAV substrate has a size of 3 mm×3 mm with two laser holes, so the top width and the bottom width of the holes may be different.

The TAV metallized aluminum nitride substrates were subjected to a reliability test, including a PCT (Pressure Cooker Test), in accordance with the protocol of JEDEC-22-A102: 121° C./100% R.H./33 psia (2 atm), 96 hrs, and a thermal shock test (TST) of the protocol: −40° C.~125° C., 200 cycles. The results show that delamination occurs in the copper-plated layers, and cracks occur at the positions after delamination, as shown in FIG. 2.

The maximal principal stress distribution results obtained by the finite element simulation analysis, as shown in FIG. 3, suggest that the aluminum nitride is subjected to the maximal principal stress of a tension at the position after the delamination when the TAV substrate is subjected to a cooling load (ΔT=−110° C.) (FIG. 3 (a)), and the aluminum nitride is subjected to the maximal principal stress of a compression when the TAV substrate is subjected to a heating load (ΔT=45° C.) (FIG. 3 (b)). Since a brittle material is mostly damaged by a tension, it is surmised that the TAV substrate is damaged by the maximal tensile stress during the cooling process. It can be observed from the drawings that the position where the cracking is most likely to occur is consistent with the direction of growth and with the reliability test results (FIG. 2).

If there are through holes which are filled with a conductive material inside the aluminum nitride substrate, copper-plated layers are formed on both sides of the substrate, and a structure with copper-plated layers on both sides of the substrate may avoid the structural asymmetry, and greatly reduce the amount of thermal deformation of the test sheets which are subjected to a temperature load although the problem of the amount of deformation of the test sheets may be overcome by this structure. However, the stress along the Y direction between the aluminum nitride and the copper-plated layer are simulated by using the finite element method during the cooling process (ΔT=−110° C.) in TST (thermal shock test) of the TAV substrates of four copper-plated thicknesses, as shown in FIG. 4. The magnitude of the stress is 48 (MPa), 128 (MPa), 203 (MPa) and 263 (MPa) corresponding to copper-plated thicknesses of 30 μm, 60 μm, 120

μm and 180 μm, respectively, and the stress increases along with the increase of the thickness. Although the asymmetric structure of the double side copper-plated layers (as shown in FIG. 6) may reduce the stress on the long side, the reduction is small, and the stress on the short side gradually increases more. It easily causes damages to TAV substrates due to excessive stress, as shown in FIG. 5.

As shown in FIG. 5, the finite element simulation analysis result shows that the substrate stress caused by the symmetrical structure of the double side copper-plated layers is slightly greater than that of the single side copper-plated layer when the thickness of the copper-plated layer is 30 μm. However, the substrate stress of the copper-plated layer on the short-side is higher than that on the long-side when the double side copper-plated layers are asymmetrical and both stresses reach a stable value as the length difference amount X increases. It is also found that the stress of the aluminum nitride substrate caused by the symmetric copper-plated structure is significantly higher than that of the single side copper-plated structure with an amount as much as 30% when the thickness of the copper-plated layer is 200 μm to infer that the increase of the amount rises as the thickness of the copper-plated layer increases. Similarly, the substrate stress of the copper-plated layer on the short side is significantly higher than that on the long side when the double side copper-plated layers are asymmetrical and both stresses reach a stable value as the length difference amount X increases. Therefore, it can be inferred from the above results that the spot where the maximal stress of the aluminum nitride substrate with asymmetric structural copper-plated layers occurs is located on the surface of the short side of the copper-plated layer, which means that the spot is the starting point where the substrate cracks.

Following the above results, the simulation analysis was also carried out regarding the thicknesses of the copper-plated layer to be 50 μm, 100 μm and 300 μm to discuss the maximal principal stress of the aluminum nitride substrates. The results are shown in FIG. 5. It can be observed that the smaller the thickness of the copper-plated layer, the smaller the difference of the maximal principal stress of the aluminum nitride substrate caused by the single-side-plated layer or by the double-side-plated layer. In other words, the difference of the stress of the aluminum nitride substrate caused by the copper plating structural designs (single side or double side, symmetrical or asymmetrical) increases as the thickness of the copper-plated layer increases. For the stable stress value of the aluminum nitride substrate with asymmetric double side copper-plated layers, the stable stress value on the short side is significantly larger than that on the long side, and the difference amount increases along with the increase of thickness of the copper-plated layer.

In view of the above, in order to achieve better practical utility, the well experienced inventor in the related field of design, development and practice provides a method for the reduction of the interfacial stress accumulation between double side copper-plated layers and an aluminum nitride substrate to overcome the drawbacks of the current structures.

SUMMARY OF THE INVENTION

In the light of the above disadvantages of the prior art, the main object of the present invention resides in providing a method for the reduction of the interfacial stress accumulation between double side copper-plated layers and an aluminum nitride substrate to fabricate double side copper-plated layers by using a photolithography process and an electroplating process for TAV copper filling and patterning. The double side copper-plated layers may be formed by first plating double side copper-plated layers of a symmetric structure at the locations of TAV through holes to serve as a stress buffer layer of the aluminum nitride substrate, and then the subsequent pattern design of the copper-plated layers is customized. According to the simulation theory calculations, it is proved that the stress which accumulates on the short-side of the copper-plated layer of the aluminum nitride substrate with the asymmetric structural double side copper-plated layers may be effectively reduced so as to facilitate the objective of the improvement of the reliability of the aluminum nitride substrate.

In order to achieve the above object, the present invention provides a method for the reduction of the interfacial stress accumulation between double side copper-plated layers and an aluminum nitride substrate, including: providing an aluminum nitride substrate; coating an adhesion layer of a thickness of 100 nm to 500 nm on the aluminum nitride substrate by sputtering, and the adhesion layer is one of a titanium alloy or a titanium/tungsten alloy; coating a copper seed layer of a thickness of 0.8 μm to 1 μm on the adhesion layer by sputtering; plating a symmetrical structural copper buffer layer of a thickness of 30 μm to 100 μm on the copper seed layer by electroplating; plating a copper-plated layer of a thickness of 30 μm to 150 μm on the symmetrical structural copper buffer layer by electroplating; and forming a nickel-plated layer of a thickness of 100 nm to 500 nm to cover the adhesion layer, the copper seed layer, the symmetric structural copper buffer layer and the copper-plated layer.

That is to say, the present invention is characterized in that a double side copper-plated layer of a symmetric structure is firstly plated at the through holes of the aluminum nitride substrate to serve as a stress buffer layer of the aluminum nitride substrate to have the efficacy of reducing stress accumulation so as to facilitate the improvement of the reliability of ceramic substrates in applications.

These and other objectives of the present invention will no doubt become obvious to those of ordinary skill in the art after reading the following detailed description of the preferred embodiment that is illustrated in the various figures and drawings.

DETAILED DESCRIPTION

Specific embodiments are provided to elaborate the details of the present invention. The advantages and efficacy thereof would be readily appreciated by persons of ordinary skill in the art from the disclosure of the present invention.

According to the prior art and to theoretical calculations, it is known that the maximal stress of the aluminum nitride substrate of the double side symmetric copper layer is greater than the maximal stress of the aluminum nitride substrate of the single side copper layer, and the greater the thickness of the copper layer, the more serious the effect is. If it is needed to reduce the stress accumulation of the TAV aluminum nitride substrate with double side copper-plated layers on the short side of the asymmetric structure, it is necessary to change the double side copper-plated layers of the aluminum nitride substrate at the through holes to be a symmetric structure so as to effectively avoid the stress to accumulate on the short side of the copper-plated layers.

Figure 1:
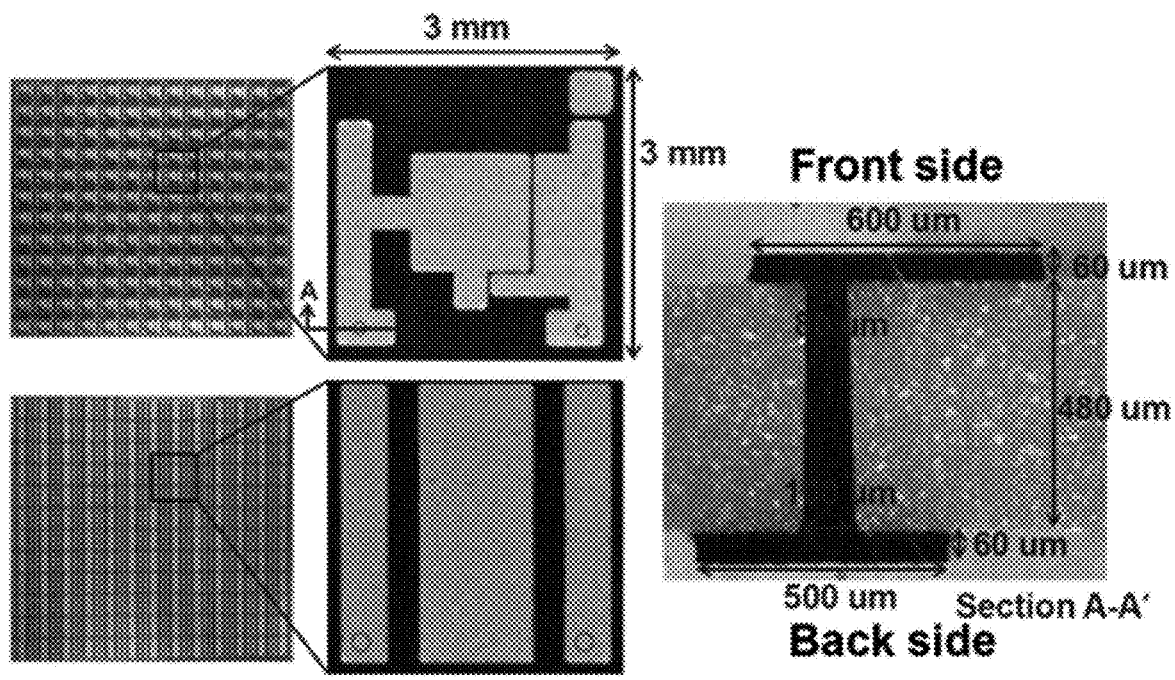
FIG. 1 shows a self-made aluminum nitride substrate with patterned metallized TAV.
Figure 2:
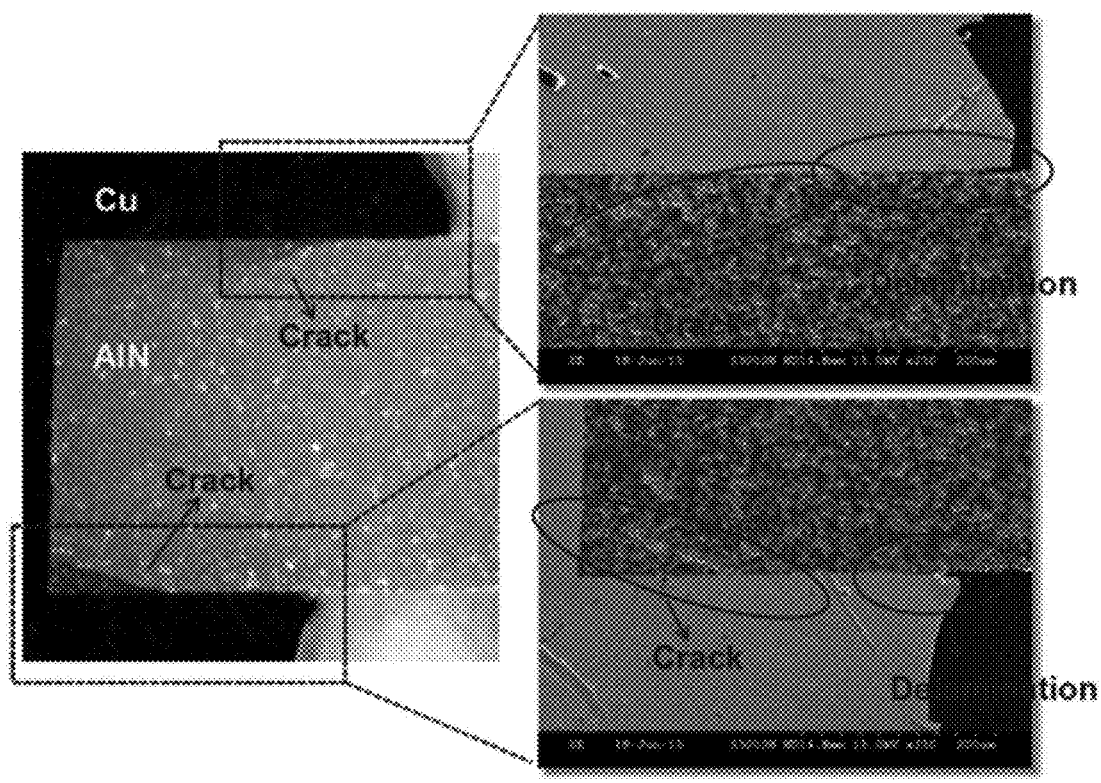
FIG. 2 shows that cracks occur at the positions after delamination of a self-made metallized aluminum nitride substrate with patterned TAV.
Figure 3:
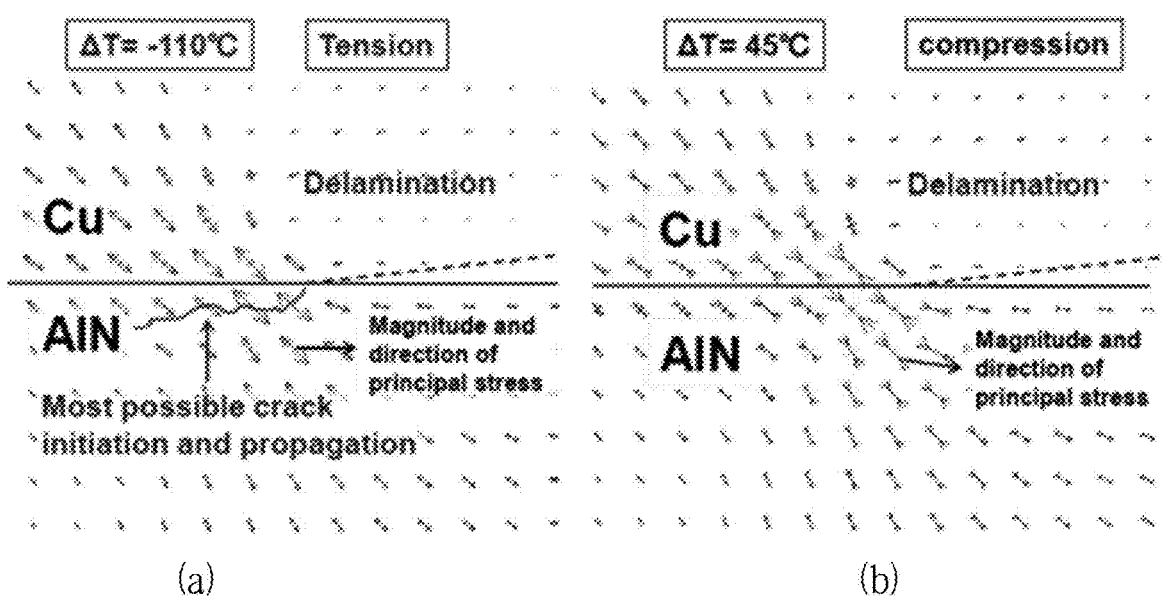
FIG. 3 shows the maximal principal stress distribution results obtained by the finite element simulation analysis, in (a) it shows that the aluminum nitride is subjected to the maximal principal stress of a tension at the position after the delamination when the TAV substrate is subjected to a cooling load, and in (b) it shows that the aluminum nitride is subjected to the maximal principal stress of a compression when the TAV substrate is subjected to a heating load.
Figure 4:
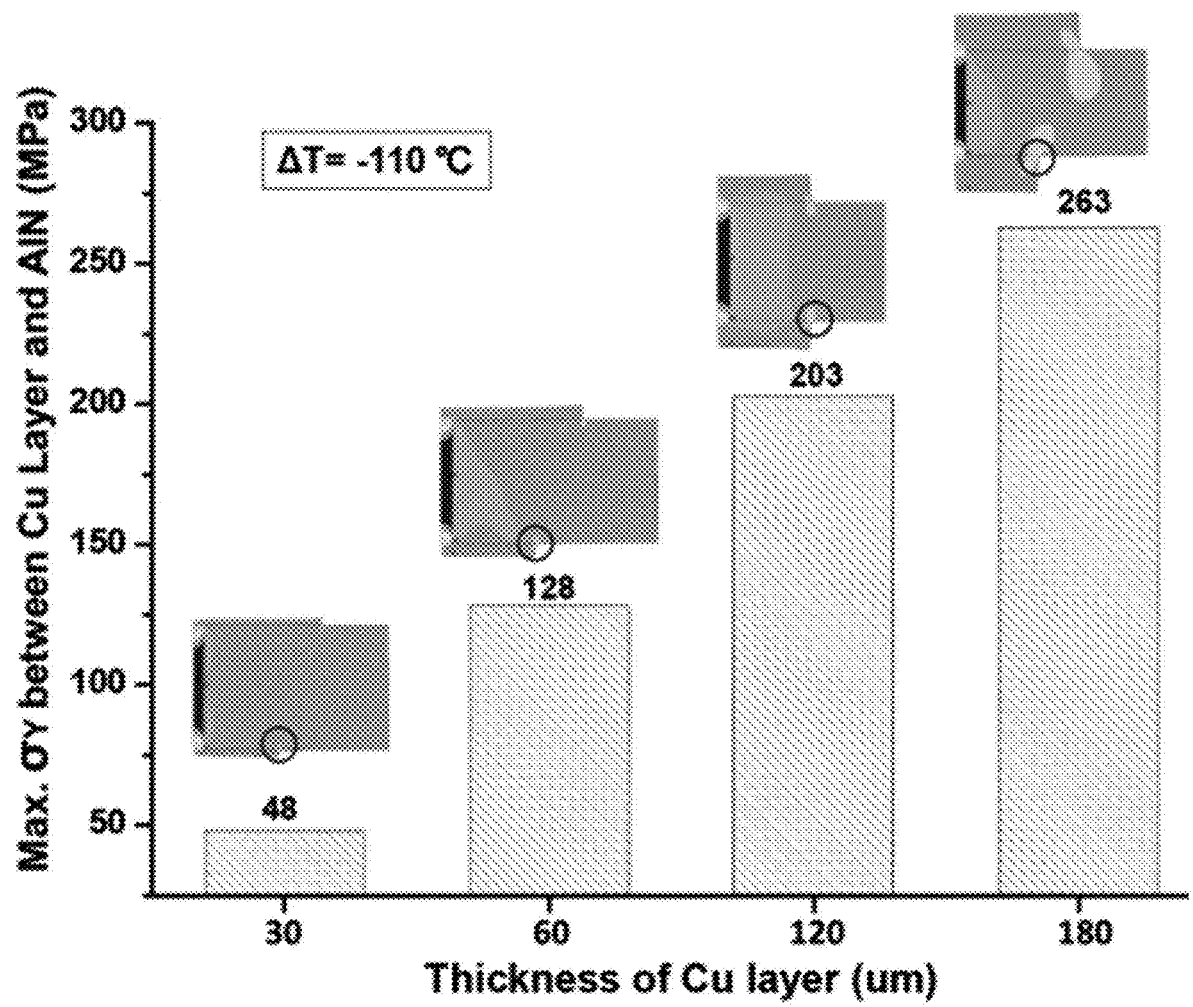
FIG. 4 shows that the stress along the Y direction between the aluminum nitride and the copper-plated layer are simulated by using the finite element method during the cooling process in the TST (thermal shock test) of the TAV substrates of four copper-plated thicknesses.
Figure 5:
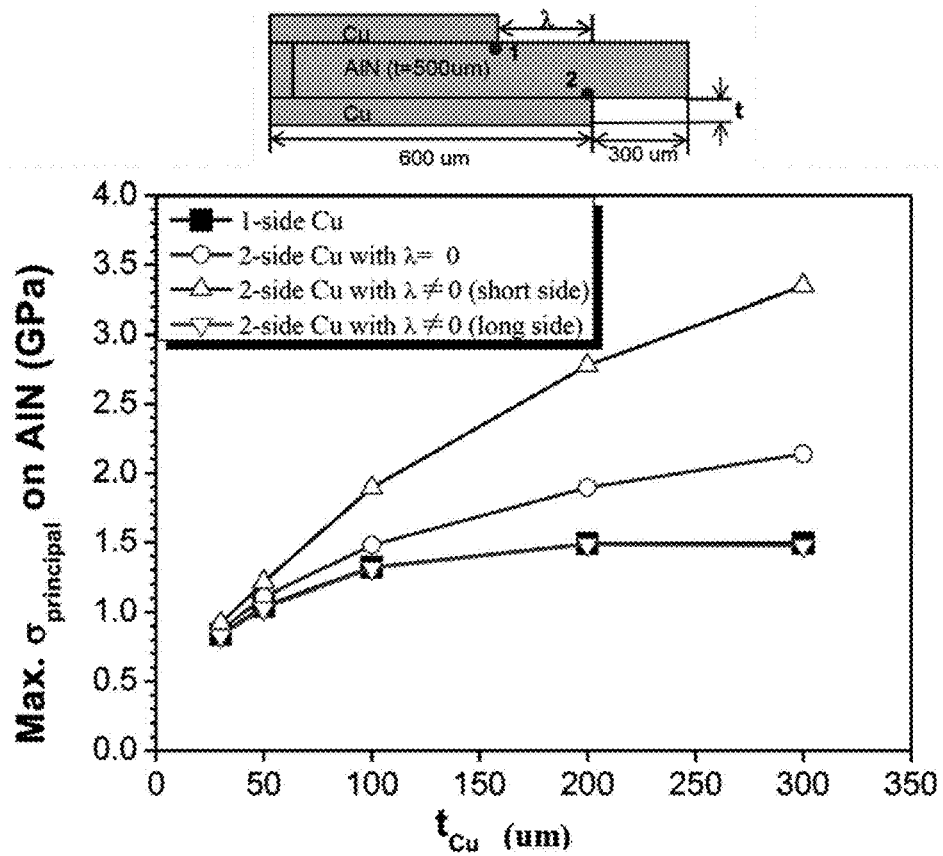
FIG. 5 shows the damages of the TAV substrates due to excessive stress.
Figure 6:
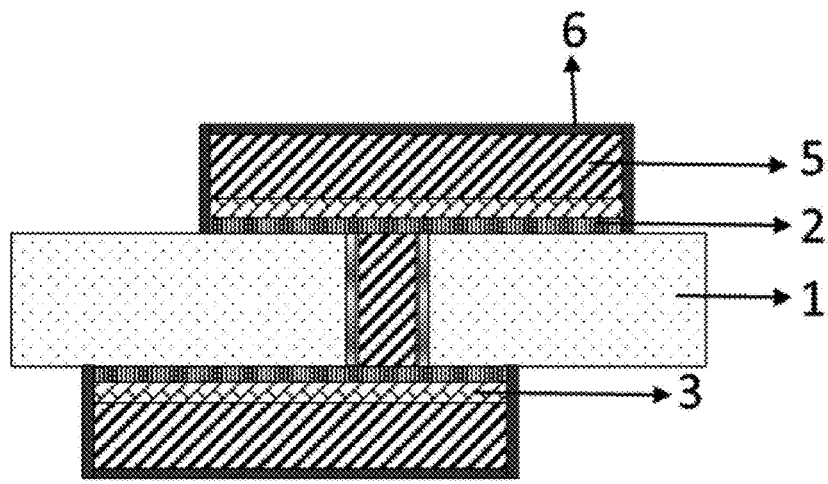
FIG. 6 shows the asymmetric structure of the double side copper-plated layers may reduce the stress on the long side.
Figure 7:
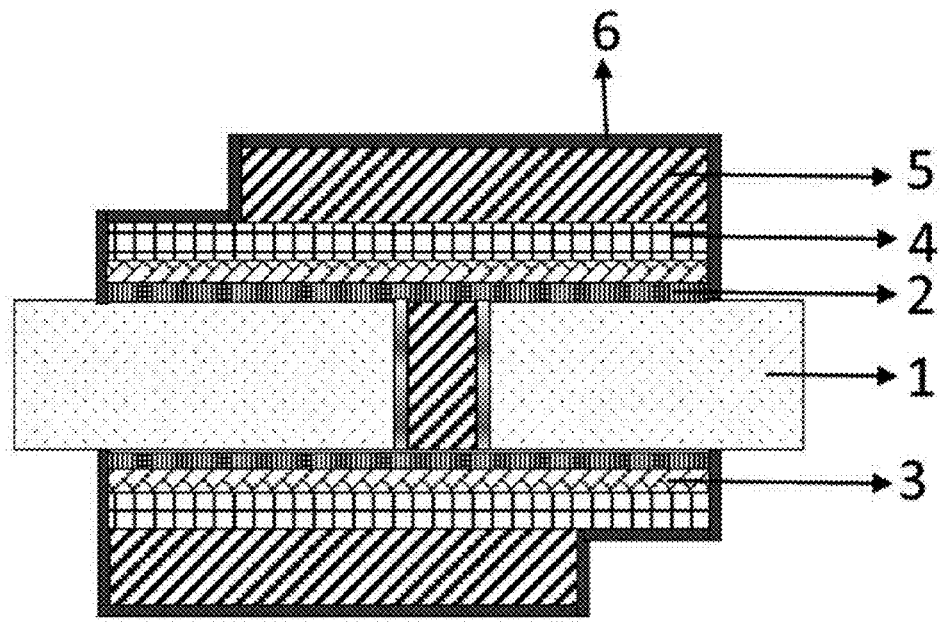
FIG. 7 is a schematic view of the structure of the double side copper-plated layer of the present invention.
Figure 8:
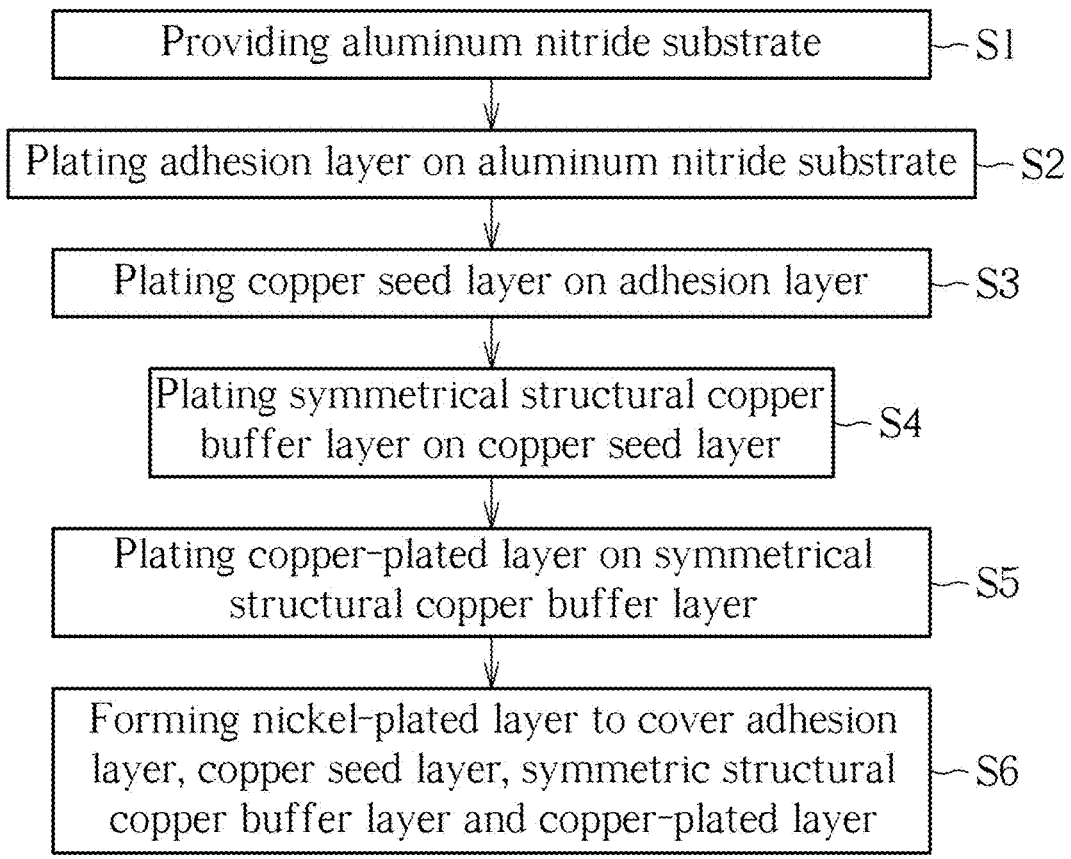
FIG. 8 is a flow chart of the method for the reduction of the interfacial stress accumulation between double side copper-plated layers and an aluminum nitride substrate according to the present invention.

Please refer to FIG. 7 and FIG. 8. FIG. 7 is a schematic view of the structure of the double side copper-plated layer of the present invention. FIG. 8 is a flow chart of the method for the reduction of the interfacial stress accumulation between double side copper-plated layers and an aluminum nitride substrate according to the present invention. As shown in the figures, a method for the reduction of the interfacial stress accumulation between double side copper-plated layers 5 and an aluminum nitride substrate 1 includes the following steps:

Step S1: providing an aluminum nitride substrate 1;

Step S2: coating an adhesion layer 2 on the aluminum nitride substrate 1 by sputtering, the adhesion layer 2 may be one of a titanium alloy or a titanium/tungsten alloy, and the adhesion layer 2 may have a thickness of 100 nm to 500 nm;

Step S3: coating a copper seed layer 3 on the adhesion layer 2 by sputtering, and the copper seed layer 3 may have a thickness of 0.8 μm to 1 μm;

Step S4: plating a symmetrical structural copper buffer layer 4 on the copper seed layer 3 by electroplating, the symmetrical structural copper buffer layer 4 may have a thickness of 30 μm to 100 μm, and the term "symmetrical structural" refers to a double side copper buffer layer which has a structure symmetrical to each other;

Step S5: plating a copper-plated layer 5 on the symmetrical structural copper buffer layer 4 by electroplating, the copper-plated layer 5 may have a thickness of 30 μm to 150 μm, and the double side copper-plated layers 5 have a structure which are asymmetrical to each other; and Step S6: forming a nickel-plated layer 6 to cover the adhesion layer 2, the copper seed layer 3, the symmetric structural copper buffer layer 4 and the copper-plated layer 5, and the nickel-plated layer 6 may have a thickness of 100 nm to 500 nm.

The present invention fabricates double side copper-plated layers 5 by using a photolithography process and an electroplating process for TAV copper filling and patterning. First a symmetrical structural copper buffer layer is plated at the location of TAV through holes to serve as a stress buffer layer of the aluminum nitride substrate 1, and then the subsequent pattern designs of the copper-plated layers 5 are customized. According to the simulation theory calculations, it is proved that the stress which accumulates on the short-side of the copper-plated layers 5 of the aluminum nitride substrate 1 with the asymmetric structural double side copper-plated layers 5 may be effectively reduced so as to facilitate the improvement of the reliability of the aluminum nitride substrate 1.

The copper-plated layers 5 of the present invention cannot be directly plated on the aluminum nitride substrate 1 because they peel off easily. Usually, a titanium alloy or a titanium/tungsten alloy is first formed to serve as an adhesion layer 2, and then a thinner copper-plated layer to serve as a copper seed layer 3 is formed by sputtering. The purpose of this layer is to facilitate the tight adhesion of copper ions to the surface and in the through holes after the capture of electrons in the subsequent electroplating process. The copper buffer layer 4 is a structure which is proposed in the present invention to solve the problem of stress accumulation. The copper-plated layer which has a symmetric structure is firstly plated at the through holes to be a symmetric structural copper buffer layer 4, in order to reduce the stress accumulation between the thick film copper-plated layer 5 and the aluminum nitride substrate 1 in the subsequent electroplating process. However, the function of the two is different. The copper seed layer 3 is for use in tightly attaching the thin film copper-plated layer which is prepared in the subsequent electroplating process, but the symmetric structural copper buffer layer 4 is used to reduce the problem of the stress accumulation between the thick film copper-plated layer 5 and the aluminum nitride substrate 1.

In addition, the detailed procedures of the method of the present invention are as follows: an aluminum nitride substrate 1 is provided; a pattern is defined on the aluminum nitride substrate 1 by a photolithography process, and the photolithography process is as follows:

(1) providing a patterned photomask, the photoresist is applied on the entire aluminum nitride substrate 1 by a spin coating method or a photoresist film is attached to it, and the photomask along with the aluminum nitride substrate 1 which is covered with the photoresist is aligned and corrected by an exposure machine, and the symmetrical pattern structure is defined at the through holes in advance with the help of a developer after the exposure is performed; (2) a titanium alloy or a titanium/tungsten alloy (Ti or Ti/W) is plated on the aluminum nitride substrate 1 by sputtering to serve as an adhesion layer 2 (thickness of the adhesion layer 2: 100 nm~500 nm); (3) plating a copper seed layer 3 (thickness: 0.8 μm~1 μm) on the aluminum nitride substrate 1 by sputtering or by chemical plating (electroless plating); (4) plating a symmetrical structural copper buffer layer 4 (thickness: 30 μm~100 μm) by electroplating; (5) removing unneeded photoresist by using a stripping solution (such as acetone) to keep the defined symmetrical structural patterned plated copper on the TAV aluminum nitride substrate 1; (6) using the photolithography process again to define a new pattern on the patterned copper-plated aluminum nitride substrate 1, plating subsequent patterned copper-plated layer 5 by electroplating; (7) finally plating a nickel-plated metal layer (thickness: 100 nm~500 nm) serving as a protection layer/barrier layer of copper-plated layer 5, to avoid the oxidation and diffusion of copper.

In summary, the present invention uses a photolithography process and an electroplating process to perform the TAV copper filling and patterning of the fabrication of the double side copper-plated layers 5, and a symmetric structural copper buffer layer is first plated at the TAV through holes to serve as a stress buffer layer of the aluminum nitride substrates 1. Then the subsequent pattern designs of the copper-plated layers 5 are customized. According to the simulation theory calculations, it is proved that the stress which accumulates on the short-side of the copper-plated layer 5 of the aluminum nitride substrate 1 with the asymmetric structural double side copper-plated layers 5 may be effectively reduced so as to facilitate the efficacy of the improvement of the reliability of the aluminum nitride substrate 1. In addition, the present invention is innovative because the problem of stress accumulation is found after the patterned aluminum nitride substrate 1 is subjected to a reliability test and the substrate is resultantly broken. In order to solve the problem of stress accumulation, it is proposed that first a symmetric structural copper buffer layer 4 is plated at the through holes to reduce the stress accumulation between the copper-plated layer 5 and the ceramic substrate. Then the subsequent asymmetric structural copper-plated layers 5 are customized. Compared with the copper-plated layer of asymmetric structure in the industry, the structure of the present invention further provides the efficacy of the reduction of the stress accumulation to effectively improve the reliability of the ceramic substrate in applications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for the reduction of the interfacial stress accumulation between double side copper-plated layers and an aluminum nitride substrate, comprising:
   providing an aluminum nitride substrate;
   coating an adhesion layer on the aluminum nitride substrate by sputtering, wherein the adhesion layer is one of a titanium alloy or a titanium/tungsten alloy;
   coating a copper seed layer on the adhesion layer by sputtering;
   plating a symmetrical structural copper buffer layer on the copper seed layer by electroplating;
   plating a copper-plated layer on the symmetrical structural copper buffer layer by electroplating; and
   forming a nickel-plated layer to cover the adhesion layer, the copper seed layer, the symmetric structural copper buffer layer and the copper-plated layer.

2. The method of for the reduction of the interfacial stress accumulation between double side copper-plated layers and an aluminum nitride substrate of claim 1, wherein the symmetrical structure copper buffer layer has a thickness of 30 μm to 100 μm.

3. A method for the reduction of the interfacial stress accumulation between double side copper-plated layers and an aluminum nitride substrate, comprising:
   providing an aluminum nitride substrate;
   coating an adhesion layer of a thickness of 100 nm to 500 nm on the aluminum nitride substrate by sputtering, wherein the adhesion layer is one of a titanium alloy or a titanium/tungsten alloy;
   coating a copper seed layer of a thickness of 0.8 μm to 1 μm on the adhesion layer by sputtering;
   plating a symmetrical structural copper buffer layer of a thickness of 30 μm to 100 μm on the copper seed layer by electroplating;
   plating a copper-plated layer of a thickness of 30 μm to 150 μm on the symmetrical structural copper buffer layer by electroplating; and
   forming a nickel-plated layer of a thickness of 100 nm to 500 nm to cover the adhesion layer, the copper seed layer, the symmetric structural copper buffer layer and the copper-plated layer.

* * * * *